United States Patent
Kawamura et al.

[11] Patent Number: 5,811,210
[45] Date of Patent: Sep. 22, 1998

[54] WATER-LESS LITHOGRAPHIC RAW PLATE

[75] Inventors: Ken Kawamura; Mikio Tsuda; Norimasa Ikeda, all of Shiga, Japan

[73] Assignee: Toray Industries, Inc., Japan

[21] Appl. No.: 446,744

[22] PCT Filed: Sep. 30, 1994

[86] PCT No.: PCT/JP94/01642

§ 371 Date: Sep. 11, 1995

§ 102(e) Date: Sep. 11, 1995

[87] PCT Pub. No.: WO95/10071

PCT Pub. Date: Apr. 13, 1995

[30] Foreign Application Priority Data

Oct. 1, 1993 [JP] Japan ................................ 5-246826

[51] Int. Cl.⁶ .......................................................... G03F 7/11
[52] U.S. Cl. ............................ 430/17; 430/162; 430/166; 430/272.1; 430/273.1; 430/303
[58] Field of Search .................................. 430/162, 166, 430/272.1, 273.1, 303, 17

[56] References Cited

FOREIGN PATENT DOCUMENTS

| 4110852 | 4/1992 | Japan . |
|---|---|---|
| 4338954 | 11/1992 | Japan . |
| 667411 | 3/1994 | Japan . |

*Primary Examiner*—Christopher G. Young
*Attorney, Agent, or Firm*—Austin R. Miller

[57] ABSTRACT

The present invention relates to a water-less lithographic raw plate, in which a photosensitive layer and a silicone rubber layer are laminated in this order on a substrate, comprising: the peel bonding strength between the photosensitive layer and the silicone rubber layer being 5 to 100 g/cm, and the initial elastic modulus of the photosensitive layer after completion of exposure being 5 to 75 kgf/mm2. In the present invention, attention is paid to the peel bonding strength between the photosensitive layer and the silicone rubber layer before exposure, and it is intensified, while the photosensitive layer after completion of exposure is kept lower in elastic modulus, to provide a water-less lithographic printing plate excellent in printing durability and image reproducibility. Therefore, the water-less lithographic printing plate obtained is suitable for commercial web offset printing and newspaper web offset printing.

9 Claims, No Drawings

WATER-LESS LITHOGRAPHIC RAW PLATE

TECHNICAL FIELD

The present invention relates to a water-less lithographic raw plate, in more detail, a water-less lithographic raw plate, in which the area exposed to an image is photo-bonded, and also to a water-less lithographic printing plate obtained from it.

BACKGROUND OF THE INVENTION

Various water-less lithographic printing plates using a silicone rubber layer as an ink repellent layer are proposed. Among them, those which allow practical printing without using dampening water include the water-less lithographic printing plates with a photo-polymerizable adhesive layer and a silicone rubber layer laminated on a substrate as proposed in Japanese Patent Publication (Koho) SHO 54-26923 and 56-23150, etc., water-less lithographic printing plates with a photo-dimerized photosensitive layer and a silicone rubber laminated on a substrate as proposed in Japanese Patent Publication (Koho) HEI 3-56622, Japanese Patent Laid-Open (Kokai) SHO 61-153655, etc., and water-less lithographic printing plates with a photosensitive diazo resin layer and a silicone rubber layer laminated on a substrate as proposed in Japanese Patent Laid-Open (Kokai) HEI 1-150142, etc.

The inventors examined in detail the performance, especially the printing durability, of the water-less lithographic printing plates obtained by these conventional typical techniques, and as a result, found that since they are not high enough in printing durability, they cannot be practically used in the areas requiring high printing durability such as commercial web offset printing area and newspaper web offset printing area.

An object of the present invention is to present a water-less lithographic raw plate which can be processed into a water-less lithographic printing plate which can show high printing durability even when it is used for commercial web offset printing or newspaper web offset printing.

Another object of the present invention is to present a practical water-less lithographic raw plate with high image reproducibility, in addition to a water-less lithographic printing plate with high printing durability.

SUMMARY OF THE INVENTION

The inventors pursued the cause for the low printing durability of the conventional water-less lithographic printing plates, and found that the insufficient bonding strength between the photosensitive layer and the silicone rubber layer, and the high initial elastic modulus of the photosensitive layer after completion of exposure cause rupture at the bonding interface after actual long-time offset printing. Especially when a water-less lithographic printing plate is used for commercial web offset printing, it is required to have a printing durability of 100,000 to 600,000 copies, and the printing is effected at a speed of 600 to 1000 rpm. It was found that, in this case, the repeated stress acts on the water-less lithographic printing plate when the ink is transferred between the printing plate and the blanket cylinder in a tendency to cause rupture at the bonding interface between the photosensitive layer and the silicone rubber layer, thus keeping the printing durability low.

This problem was examined intensively, and as a result, it was found that if the preliminary bonding strength between the photosensitive layer and the silicone rubber in the water-less lithographic raw plate (the peel bonding strength before exposure) is intensified, the lithographic printing plate obtained by exposing the raw plate to an image-can achieve strong photo bonding between the non-image area (exposed area) of the photosensitive layer and the silicone rubber, and that if the photosensitive layer is lower in elastic modulus, the repeated stress acting on the silicone rubber layer and the photosensitive layer at the time of offset printing can be eased, to provide a water-less lithographic printing plate excellent in printing durability and image reproducibility. Thus, in the present invention, since the preliminary bonding strength between the photosensitive layer and the silicone rubber layer in the raw plate not yet exposed (the peel bonding strength before exposure) is intensified, the water-less lithographic printing plate obtained after exposing the raw plate to an image achieves strong photo bonding between the non-image area (exposed area) of the photosensitive layer and the silicone rubber layer, and since the photosensitive layer is low in elastic modulus after completion of exposure, the repeated stress acting on the silicone rubber layer and the photosensitive layer at the time of offset printing can be eased, to provide a water-less lithographic printing plate dramatically improved in printing durability and excellent in image reproducibility. Therefore, it is sufficiently practical even in areas requiring high printing durability, such as commercial web offset printing area and the newspaper web offset printing area.

THE MOST PREFERRED EMBODIMENT OF THE INVENTION

The water-less lithographic raw plate of the present invention is a water-less lithographic raw plate, in which a photosensitive layer and a silicone rubber layer are laminated in this order on a substrate, comprising;

the peel bonding strength between the photosensitive layer and the silicone rubber layer being 5 to 100 g/cm, and the initial elastic modulus of the photosensitive layer after completion of exposure being 5 to 75 kgf/mm2.

The constitution of the water-less lithographic raw plate of the present invention is described below in detail.

The substrate of the water-less lithographic raw plate used in the present invention is a sheet good in dimensional stability. The sheet good in dimensional stability can be selected from those used as the substrates of the conventional printing plates, for example, paper, plastic films (e.g., polyethylene, polyethylene terephthalate, polystyrene, polypropylene, polycarbonate, polyvinyl acetate, etc.), metallic sheets (e.g., aluminum, iron, zinc, copper, etc.).

The water-less lithographic raw plate used in the present invention may be provided with a primer layer for intensifying the bonding between the substrate and the photosensitive layer. It is important that the primer layer can well bond the substrate and the photosensitive layer and is stable over time and excellent in the resistance against the solvent in the developing solution.

The primer layer which satisfies the above conditions can be made of any of those containing an epoxy resin disclosed in Japanese Patent Publication (Koho) SHO 61-54219, or also urethane resin, phenol resin, acrylic resin, alkyd resin, polyester resin, polyamide resin, or melamine resin. Furthermore, a material obtained by photo-setting a composition similar to that of the photosensitive layer can also be used. Moreover, the primer layer can contain additives such as dye and pigment for prevention of halation and other purposes. As for the photosensitive layer of the water-less lithographic raw plate of the present invention, it is important that the peel bonding strength between the photosensitive layer and the silicone rubber layer is 5 to 100 g/cm, preferably 10 to 80 g/cm, more preferably 20 to 70 g/cm. If the raw plate not yet exposed has the photosensitive layer and the silicone rubber layer intensively and preliminarily bonded, the water-less lithographic printing plate obtained by irradiating it with active rays (ultraviolet rays, etc.) for exposure to an image has the non-image area of the photosensitive layer and the silicone rubber layer above it further intensively photo-bonded. If the peel bonding strength is less than 5 g/cm, the exposed water-less lithographic printing plate is insufficient in printing durability. If more than 100 g/cm, developability is remarkably poor.

The peel bonding strength between the photosensitive layer and the silicone rubber layer in the present invention refers to the value measured according to the following method.

[Peel Bonding Strength Measuring Method]

A 50 m polyethylene terephthalate film "Lumilar" (produced by Toray Industries, Inc.) is coated with an adhesive consisting of "Primer" T (produced by Shin-Etsu Chemical Co., Ltd.) and 3-aminopropyltrimethoxysilane (produced by Chisso K.K.) at a ratio by weight of 9:1, and dried at 120-C for 2 minutes, to form an adhesive layer. The adhesive layer must be formed with a peel bonding strength higher than the peel bonding strength between the photosensitive layer and the silicone rubber layer, so that peeling may occur between the photosensitive layer and the silicone rubber layer in a subsequent step.

On the other hand, from the water-less lithographic raw plate, its protective film is removed, and the water-less lithographic raw plate is laminated on the above adhesive coated film, to have the silicone rubber layer and the adhesive layer kept in contact with each other. The lamination is allowed to stand at room temperature for 5 days. The sample obtained like this is cut into test pieces of 4 cm in width and 20 cm in length. The test piece is stuck onto a retainer mounted on Tensilon RTM-100 (produced by Orienteck K.K.), and is attached to an upper retainer in such a way that the polyethylene terephthalate film of the test piece may be removed from the bottom, to cause peeling between the photosensitive layer and the silicone rubber layer. The peeling is effected at a peel angle of 160 degrees and a tensile speed of 20 cm/min, to measure the mean peel bonding strength.

In the present invention, it is also important the initial elastic modulus of the photosensitive layer after completion of exposure is 5 to 75 kgf/mm2, preferably 10 to 65 kgf/mm2, more preferably 10 to 60 kgf/mm2, further more preferably 10 to 50 kgf/mm2. If the initial elastic modulus after completion of exposure is less than 5 kgf/mm2, the photosensitive layer is fragile, and may be broken during printing. If more than 75 kgf/mm2, the photosensitive layer is too hard, and in the case of offset printing, repeated stress acts between the photosensitive layer and the silicone rubber layer, and rupture occurs at the bonding interface between the photosensitive layer and the silicone rubber layer, not providing the desired high printing durability.

Furthermore, it is preferable that the rupture elongation of the photosensitive layer after completion of exposure is 100% or more, more preferably 120% or more, further more preferably 150% or more. If the rupture elongation is less than 100%, the photosensitive layer is fragile, and in offset printing, the photosensitive layer is broken, not providing the desired high printing durability.

Moreover, it is preferable that the 50% stress value of the photosensitive layer after completion of exposure is 0.8 to 3.8 kgf/mm2, more preferably 1.0 to 3.2 kg/mm2, further more preferably 1.2 to 2.6 kgf/mm2. If the 50% stress value is less than 0.8 kgf/mm2, the photosensitive layer becomes sticky, to cause hickey marks during printing. If more than 3.8 kgf/mm2, repeated stress caused by the hardness of the photosensitive layer acts, that is, repeated stress acts between the photosensitive layer and the silicone rubber layer, to cause rupture at the bonding interface between the photosensitive layer and the silicone rubber layer, not providing the desired high printing durability.

The initial elastic modulus, rupture elongation and 50% stress value of the photosensitive layer after completion of exposure in the present invention refer to the values measured according to the following methods.

[Methods for measuring the initial elastic modulus, rupture elongation and 50% stress value of the photosensitive layer]

These photosensitive layer tensile properties can be measured according to JIS K 6301. That is, a water-less lithographic raw plate not yet exposed is immersed in a soluble solvent, to let the silicone rubber layer and the photosensitive layer come off from the substrate, to be dissolved. The solution obtained is filtered, and the silicone rubber layer insoluble in the soluble solvent is separated. Furthermore, the solution is concentrated under reduced pressure to a solid content of 30%, for use as a sensitizing solution. The sensitizing solution is applied onto a glass sheet, and dried, and the photosensitive sheet formed is removed from the glass sheet, to obtain an about 300 ＋m thick sheet. From it, test pieces are prepared using a No. 4 dumbbell, and are irradiated with a 3 kW extra-high pressure mercury lamp (produced by Oak Seisakusho) at an illuminance of 12 mw/cm2 by a UV meter (Light Measure Type UV365 produced by Oak Seisakusho) for exposure for 10 minutes. The initial elastic modulus, rupture elongation and 50% stress value of the test pieces are measured using Tensilon RTM-100 (produced by Orienteck K.K.) at a tensile speed of 20 cm/min according to JIS K 6301.

The photosensitive layer of the water-less lithographic raw plate can be a photopolymerizable photosensitive layer. The photopolymerizable photosensitive layer can preferably use an ethylenic unsaturated compound which is generally composed of the following:

| | |
|---|---|
| (1) A photopolymerizable unsaturated monomer or oligomer | 0.0 to 100 parts by weight |
| (2) An ethylenic unsaturated compound with an organic silyl group | 0.1 to 100 parts by weight |
| (3) A photopolymerization initiator | 0.1 to 20 parts by weight |
| (4) A thermal polymerization inhibitor added as required | 0.01 to 10 parts by weight |
| (5) A filler for holding the form of the photopolymerizable layer added as required (polymer or inorganic powder) | 0.01 to 100 parts by weight |

The photopolymerizable unsaturated monomer or oligomer can be selected from the compounds represented by the following general formulae (I) and (II).

The compounds (I) are described below.

$$R_1R_2N-(X_1)_p-(X_2)_q-NR_3R_4 \qquad (1)$$

(where X1 stands for a divalent connecting group selected from substituted or non-substituted cyclic or non-cyclic alkylenes with 1 to 20 carbon atoms, substituted or non-substituted phenylenes, substituted or non-substituted aralkylenes, and the substituent group can be selected from an alkyl group with 1 to 6 carbon atoms, halogen atoms, hydroxyl group and aryl groups; X2 stands for —OE1—, —S—E—2, —NH—E3—, —CO—O—E4—, or SO2—NH—E—5—, where E1, E2, E3, E4 and E5 stand for, respectively independently, a divalent connecting group selected from the above alkylenes, phenylenes, and aralkylenes; p stands for an integer of 1 or more, while q stands for an integer of 0 or more, but —CH2—C6H4—CH2— is not included; R1, R2, R3 and R4 stand for, respectively independently, a hydrogen atom, substituted or non-substituted alkyl group with 1 to 20 carbon atoms, substituted or non-substituted phenyl group, substituted or non-substituted aralkyl group, and functional group selected from the following formulae (III), (IV) and (V), and the substituent group can be selected from alkyl groups with 1 to 6 carbon atoms, halogen atoms, hydroxyl group and aryl groups; however the compound (I) contains at least one or more ethylenic unsaturated groups in one molecule; R5, R6 and R7 stand for, respectively independently, a hydrogen atom, substituted or non-substituted alkyl group with 1 to 20 carbon atoms, substituted or non-substituted phenyl group, substituted or non-substituted aralkyl group, CH2=CH— group, or CH2=CCH3— group; Y stands for —CO—O—, —CO—NH—, or substituted or non-substituted phenylene group; X3, X4, X5 stand for, respectively independently, any of those specified for X1 and X2; and m and n stand for, respectively independently, 0 or 1)

R1R2N—CH2—C6H4—CH2—NR3R4         (II)

(where R1, R2, R3 and R4 are as specified for the above formula (I))

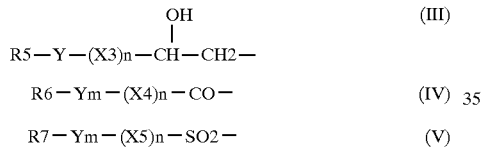

$$R5-Y-(X3)_n-\overset{\overset{\displaystyle OH}{|}}{CH}-CH2- \quad (III)$$

$$R6-Y_m-(X4)_n-CO- \quad (IV)$$

$$R7-Y_m-(X5)_n-SO2- \quad (V)$$

Especially a compound obtained by the reaction to add glycidyl (meth)acrylate with a photopolymerizable group and a monoglycidyl ether compound without any photopolymerizable group to any of the following diamine compounds can be preferably used.

| | |
|---|---|
| (1) A diamine compound (monooxyethylenediamine, dioxyethylenediamine, trioxyethylenediamine, decaoxyethylenediamine, tritriacontaoxyethylenediamine, monooxypropylenediamine, dioxypropylenediamine, trioxypropylenediamine, decaoxypropylenediamine, tritriacontaoxypropylenediamine, N-hydroxyethylhexapropylenediamine, N-hydroxyisopropylhexapropylenediamine, N,N'-dihydroxyethylhexapropylenediamine, trimethylenebis(4-aminobenzoate), tetramethyleneglycolbis(4-aminobenzoate), dibutyleneglycolbis(4-aminobenzoate), etc.) | 1 mol |
| (2) Glycidyl (meth)acrylate | 4-n mol |
| (3) A monoglycidyl ether compound (methylglycidyl ether, ethylglycidyl ether, n-propylglycidyl ether, isopropylglycidyl ether, n-butylglycidyl ether, isobutylglycidyl ether, n-hexylglycidyl ether, 2-ethylhexylglycidyl ether, allylglycidyl ether, phenylglycidyl ether, etc.) | n mol |

(n stands for an integer of 0 ≦ n ≦ 4)

The addition reaction products of the above are useful. The addition reaction products include, but are not limited to, the following:

N,N,N',N'-tetra-(2-hydroxy-3-methacryloyloxypropyl) monooxyethylenediamine, N,N,N',N'-tetra-(2-hydroxy-3-methacryloyloxypropyl) dioxyethylenediamine, N,N,N',N'-tetra-(2-hydroxy-3-methacryloyloxypropyl)decaoxyethylenediamine, N,N,N',N'-tetra-(2-hydroxy-3-methacryloyloxypropyl) tritriacontaoxyethylenediamine, N,N,N',N'-tetra-(2-hydroxy-3-acryloyloxypropyl)trioxyethylenediamine, N,N,N'-tri-(2-hydroxy-3-methacryloyloxypropyl)-N'-mono-(2-hydroxy-3-methoxypropyl) monooxyethylenediamine, N,N,N'-tri-(2-hydroxy-3-methacryloyloxypropyl)-N'-mono-(2-hydroxy-3-methoxypropyl) dioxyethylenediamine, N,N'-di-(2-hydroxy-3-methacryloyloxypropyl)-N,N'-di-(2-hydroxy-3-methoxypropyl)monooxyethylenediamine, N,N'-di-(2-hydroxy-3-methacryloyloxypropyl)-N,N'-di-(2-hydroxy-3-methoxypropyl) dioxyethylenediamine, N,N,N'-tri-(2-hydroxy-3-methacryloyloxypropyl)-N'-mono-(2-hydroxy-3-butoxypropyl) monooxyethylenediamine, N,N,N'-tri-(2-hydroxy-3-methacryloyloxypropyl)-N'-mono-(2-hydroxy-3-butoxypropyl) dioxyethylenediamine, N,N'-di-(2-hydroxy-3-methacryloyloxypropyl)-N,N'-di-(2-hydroxy-3-butoxypropyl)monooxyethylenediamine, N,N'-di-(2-hydroxy-3-methacryloyloxypropyl)-N,N'-di-(2-hydroxy-3-butoxypropyl)dioxyethylenediamine, N,N,N',N'-tetra-(2-hydroxy-3-methacyloyloxypropyl) monooxypropylenediamine, N,N,N',N'-tetra-(2-hydroxy-3-methacryloyloxypropyl) decaoxypropylenediamine, N,N,N',N'-tetra-(2-hydroxy-3-methacryloyloxypropyl) tritriacontaoxypropylenediamine, N,N,N',N'-tetra-(2-hydroxy-3-acryloyloxypropyl) trioxypropylenediamine, N,N,N',N'-tetra-(2-hydroxy-3-acryloyloxypropyl) hexaoxypropylenediamine, N,N,N'-tri'(2-hydroxy-3-methacryloyloxypropyl)-N'-mono-(2-hydroxy-3-methoxypropyl) monooxypropylenediamine, N,N,N'-tri-(2-hydroxy-3-methacryloyloxypropyl)-N'-mono-(2-hydroxy-3-methoxypropyl) dioxypropylenediamine, N,N,N'-tri-(2-hydroxy-3-methacryloyloxypropyl)-N'-mono(2-hydroxy-3-methoxypropyl) decaoxypropylenediamine, N,N'-di'-(2-hydroxy-3-methacryloyloxypropyl)-N,N'-di-(2-hydroxy-3-methoxypropyl) monooxpropylenediamine, N,N'-di-(2-hydroxy-3-methacryloyloxypropyl)-N,N'-di-(2-hydroxy-3-methoxypropyl) dioxypropylenediamine, N,N,N'-tri-(2-hydroxy-3-methacryloyloxypropyl)-N'-mono-(2-hydroxy-3-butoxypropyl) monooxypropylenediamine, N,N,N'-tri-(2-hydroxy-3-methacryloyloxypropyl)-N'-mono-(2-hydroxy-3-butoxypropyl) dioxypropylenediamine, N,N'-di-(2-hydroxy-3-methacryloyloxypropyl)-N,N'-di-(2-hydroxy-3-butoxypropyl)monooxypropylenediamine, N,N'-di-(2-hydroxy-3-methacryloyloxypropyl)-N,N'-di-(2-hydroxy-3-butoxypropyl)dioxypropylenediamine, N,N,N'-tri-(2-hydroxy-3-methacrloyloxypropyl)-N'-mono-(2-hydroxy-3-2ethylhexyloxypropyl) trioxypropylenediamine, N,N,N'-tri-(2-hydroxy-3-methacryloyloxypropyl)-N'-mono-(2-hydroxy-3-phenoxypropyl) trioxypropylenediamine, etc.)

Preferable reaction products include a reaction product obtained from 1 mole of oxypropylenediamine of 1 to 10 as n and 4 moles of glycidyl methacrylate, and reaction products obtained from 1 mole of oxypropylenediamine of 1 to 10 as n, 2 to 3 moles of glycidyl methacrylate and 2 to l mole of a monoglycidyl ether compound selected from methylglycidyl ether, ethylglycidyl ether, n-propylglycidyl ether, isopropylglycidyl ether and n-butylglycidyl ether.

The compounds (II) are described below.

R1R2N—CH2—C6H4—CH2—NR3R4         (I

I)
(where R1, R2, R3 and R4 are as specified for the formula (I)) The compound represented by the general formula (II) can be preferably obtained by the reaction to add glycidyl (meth)acrylate with a photopolymerizable group and a monoglycidyl ether compound without any photopolymerizable group to a xylylenediamine compound.

For example, the addition reaction products of the following are useful.

| | |
|---|---|
| (1) A diamine compound (o-xylylenediamine, m-xylylenediamine, p-xylylenediamine, N-hydroxyethyl-m-xylylenediamine, N-hydroxyisopropyl-m-xylylenediamine, N,N'-dihydroxyethyl-m-xylylenediamine, N,N'-dihydroxyisopropyl-m-xylylenediamine, etc.) | 1 mol |
| (2) Glycidyl (meth)acrylate | 4-n mol |
| (3) A monoglycidyl ether compound | n mol |

(n stands for an integer of $1 \leq n \leq 3$)

Examples are enumerated below.

N,N,N'-tri-(2-hydroxy-3-methacryloyloxypropyl)-N'-mono-(2-hydroxy-3-methoxypropyl)m-xylylenediamine, N,N,N'-tri-(2-hydroxy-3-methacryloyloxypropyl)-N'-mono-(2-hydroxy-3-methoxypropyl)p-xylylenediamine, N,N'-di-(2-hydroxy-3-methacryloyloxypropyl)-N,N'-di-(2-hydroxy-3-methoxypropyl)m-xylylenediamine, N,N'-di-(2-hydroxy-3-methacryloyloxypropyl)-N,N'-di-(2-hydroxy-3-methoxypropyl)p-xylylenediamine, N-mono-(2-hydroxy-3-methacryloyloxypropyl)-N,N'N'-tri-(2-hydroxy-3-methoxypropyl)m-xylylenediamine, N-mono-(2-hydroxy-3-methacryloyloxypropyl)-N,N',N'-tri-(2-hydroxy-3-methoxypropyl)p-xylylenediamine, N,N,N'-tri-(2-hydroxy-3-acryloyloxypropyl)-N'-mono-(2-hydroxy-3-methoxypropyl)m-xylylenediamine, N,N,N'-tri-(2-hydroxy-3-acryloyloxypropyl)-N'-mono-(2-hydroxy-3-methoxypropyl)p-xylylenediamine, N-mono-(2-hydroxy-3-methacryloyloxypropyl)-N,N',N'-tri-(2-hydroxy-3-methoxypropyl)m-xylylenediamine, N-mono-(2-hydroxy-3-methacryloyloxypropyl)-N,N',N'-tri-(2-hydroxy-3-methoxypropyl)p-xylylenediamine, N,N,N'-tri-(2-hydroxy-3-methacryloyloxypropyl)-N'-mono-(2-hydroxy-3-butoxypropyl)m-xylylenediamine, N,N,N'-tri-(2-hydroxy-3-methacryloyoxypropyl)-N'-mono-(2-hydroxy-3-butoxypropyl)p-xylylenediamine, N,N'-di-(2-hydroxy-3-methacryloyloxypropyl)-N,N'-di-(2-hydroxy-3-butoxypropyl)m-xylylenediamine, N,N'-di-(2-hydroxy-3-methacryloyloxypropyl)-N,N'-di-(2-hydroxy-3-butoxypropyl)p-xylylenediamine, N,N,N'-tri-(2-hydroxy-3-methacryloyloxypropyl)-N'-mono-(2-hydroxy-3-2ethylhexyloxypropyl)m-xylylenediamine, N,N,N'-tri-(2-hydroxy-3-methacryloyloxypropyl)-N'-mono-(2-hydroxy-3-2ethylhexyloxypropyl)p-xylylenediamine, N,N'-di-(2-hydroxy-3-methacrloyloxypropyl)-N,N'-di-(2-hydroxy-3-2ethylhexyloxypropyl)m-xylylenediamine, N,N'-di-(2-hydroxy-3-methacryloyoxypropyl)-N,N'-di-(2-hydroxy-3-2ethylhexyloxypropyl)p-xylylenediamine, N,N'-di-(2-hydroxy-3-methacryloyloxypropyl)-N,N'-di-(2-hydroxy-3-phenoxypropyl)m-xylylenediamine, N,N'-di-(2-hydroxy-3-methacryloyloxypropyl)-N,N'-di-(2-hydroxy-3-phenoxypropyl)p-xylylenediamine, etc. Preferable addition reaction products include those obtained from 1 mole of m-xylylenediamine or p-xylylenediamine, 2 moles of glycidyl methacrylate and 2 moles of a monoglycidyl ether compound selected from methylglycidyl ether, ethyl glycidyl ether, n-propylglycidyl ether, isopropylglycidyl ether and n-butylglycidyl ether.

The ethylenic unsaturated compound with an organic silyl group is described below.

The ethylenic unsaturated compound with at least one or more organic silyl groups in the molecule, to be contained in the photosensitive layer can be preferably a photopolymerizable ethylenic unsaturated compound.

The organic silyl groups referred to in the present invention can be classified into two major categories; hydrolyzable active silyl groups, and non-hydrolyzable silyl groups.

The first hydrolyzable active silyl groups include such silyl groups as alkoxysilyl groups, acetoxysilyl groups and oximesilyl groups which can be hydrolyzed to regenerate highly reactive groups such as silanol groups, and such silyl groups as trimethylsiloxy groups, triethylsilyloxy groups and triphenylsiloxy groups which can be hydrolyzed to regenerate alcoholic hydroxyl groups.

The ethylenic unsaturated compound with such a hydrolyzable active silyl group is not limited at all in the molecular structure as far as any of said active silyl groups and a photopolymerizable ethylenic unsaturated group exist in one molecule, but the following compounds are general in view of easy synthesis and availability.

The photopolymerizable ethylenic unsaturated compounds include ethylenic unsaturated group compounds such as (meth)acrylates, allyl esters, (meth)acrylamide, etc. derived from polyhydric alcohols with 30 or less carbon atoms, polyacids, acid anhydrides and polyamines, and epoxy ester addition products. As a general method, during or at the end of the step of synthesizing any of them, a compound with any of the organic silyl groups defined above is caused to react with it, for incorporating the organic silyl group into one molecule. The organic silyl group compound used for the reaction can be selected from chloroalkylsilyl compounds, epoxyalkylsilyl compounds, aminoalkylsilyl compounds, mercaptoalkylsilyl compounds, isocyanatopropylsilyl compounds, etc., and their chlorosilyl groups, epoxy groups, amino groups, mercapto groups or isocyanate groups, etc. can be used for reaction. Especially a reaction product between an epoxyalkylsilyl compound and an amino group-containing ethylenic unsaturated compound, and a reaction product between an aminoalkylsilyl compound and an epoxy group-containing ethylenic unsaturated compound can be preferably used in view of easy synthesis and the availability of raw materials.

The epoxyalkyl silyl compound can be selected, for example, from 3-glycidoxypropylmethyldimethoxysilane, 3-glycidoxypropyltrimethoxysilane, 3-(N-allyl-N-glycidyl)aminopropyltrimethoxysilane, N-glycidyl-N,N-bis[3-(methyldimethoxysilyl)propyl]amine, N-glycidyl-N,N'-bis[3-(trimethoxysilyl)propyl]amine, etc.

The amino group-containing ethylenic unsaturated compound can be obtained by the reaction between a known amine compound and an epoxy group-containing ethylenic unsaturated compound. The epoxy group-containing ethylenic unsaturated compound can be, for example, glycidyl (meth)acrylate.

These reactions may use any epoxy compound not containing any organic silyl group, as required.

The aminoalkylsilyl compound can be selected, for example, from 4-aminobutyldimethylmethoxysilane, 4-aminobutyltriethoxysilane, 4-aminobutyltrimethoxysilane, (aminoethylaminomethyl) phenethyltrimethoxysilane, N-(2-aminoethyl)-3-aminopropylmethylmethyldimethoxysilane, N-(2-aminoethyl)-3-aminopropyltrimethoxysilane, N-(2-aminoethyl)-3-aminopropyltris(2-ethylhexoxy)silane, 6-(aminohexylaminopropyl)trimethoxysilane, p-aminophenyltrimethoxysilane, 3-(1-aminopropoxy)3,3-dimethyl-1-propenyltrimethoxysilane, 3-aminopropyltris (methoxyethoxyethoxy) silane, 3-aminopropylmethyldiethoxysilane, 3-aminopropyltriethoxysilane, 3-aminopropyltrimethoxysilane, 3-aminopropyltris (trimethylsiloxy)silane, etc.

The second non-hydrolizable silyl group means a non-reactive silyl group, and can be selected from alkyl silyl groups, allylsilyl group, etc. The ethylenic unsaturated group compound with such a non-hydrolizable silyl group is not limited at all in molecular structure, as far as any of said non-reactive silyl groups and a photopolymerizable or photo-crosslinkable ethylenic unsaturated group exist in one molecule.

The photosensitive layer can contain a known monomer or oligomer for the purpose of sensitivity adjustment, in addition to these monomers with specific structures and functions. The monomer or oligomer can be selected, for example, from (meth)acrylates of alcohols (ethanol, propanol, hexanol, glycerol, trimethylolpropane, pentaerythritol, isoamyl alcohol, lauryl alcohol, stearyl alcohol, ethoxyethylene glycol, methoxyethylene glycol, methoxypropylene glycol, phenoxy ethanol, phenoxydiethylene glycol, tetrahydrofurfuryl alcohol, etc.), addition reaction products between any of carboxylic acids (acetic acid, propionic acid, benzoic acid, acrylic acid, methacrylic acid, succinic acid, maleic acid, phthalic acid, tartaric acid, citric acid, etc.) and glycidyl (meth)acrylate or tetraglycidyl-m-xylylenediamine or tetraglycidyl-m-tetrahydroxylylenediamine, addition reaction products between any of amide derivatives (acrylamide, methacrylamide, n-methylolacrylamide, methylenebisacrylamide, etc.), epoxy compound and (meth) acrylic acid.

Furthermore, concretely, it can be also selected from urethane acrylate stated in Japanese Patent Publication (Koho) SHO 48-41708 and 50-6034 and Japanese Patent Laid-Open (Kokai) SHO 51-37193, polyester acrylates stated in Japanese Patent Laid-Open (Kokai) SHO 48-64183 and Japanese Patent Publication (Koho) SHO 49-43191 and 52-30490, polyfunctional epoxy (meth)acrylate prepared by the reaction between epoxy resin and (meth)acrylic acid, N-methylolacrylamide derivatives stated in U.S. Pat. No. 4,540,649. Moreover, it can also be selected from photosetting monomers and oligomers introduced in Journal of Japanese Bonding Association, Vol. 20, No. 7, p. 300~308.

If a monomer or oligomer with two or more hydroxyl groups is selected from these monomers and oligomers, the peel bonding strength can be enhanced. The reason is surmised to be that the hydroxyl groups in the monomer react with the crosslinking agent in the silicone rubber, to enhance the peel bonding strength. The more the hydroxyl groups, the higher the peel bonding strength, needless to say.

The photopolymerization initiator can be selected from the following:
(1) Benzophenone derivatives such as benzophenone, Michler's ketone, 4,4-bisdiethylaminobenzophenone, xanthone, anthrone, etc.
(2) Benzoin derivatives such as benzoin, benzoinmethyl ether, benzoinethyl ether, etc.
(3) Quinones such as P-benzoquinone, b-naphthoquinone, b-methylanthraquinone, etc.
(4) Thioxanthones such as thioxanthone, 2-chlorothioxanthone, isopropylthioxanthone, 2,4-diethylthioxanthone, etc.

From these photopolymerization initiators, the most suitable one can be selected, considering the compatibility with the other ingredients of the photosensitive layer, the spectrum of the light source used for exposure, etc.

Typical thermal polymerization inhibitors are hydroquinone, phenothiazine, etc.

The binder polymer as a photosensitive layer form holding agent can be selected from the following polymers.

The binder polymer of the photosensitive layer for holding its form can be any polymer which allows the use of an organic solvent and can be formed into a film, but preferably a polymer or copolymer of 0-C or lower in glass transition temperature (Tg).

The binder polymer can be typically selected from, but not limited to, the following polymers.

(1) Vinyl Polymers

Polymers and copolymers obtained from the following monomers and their derivatives.

Ethylene, propylene, 1-butene, styrene, butadiene, isoprene, vinyl chloride, vinyl acetate, methyl acrylate, ethyl acrylate, isopropyl acrylate, n-butyl acrylate, 2-ethylhexyl acrylate, methyl methacrylate, ethyl methacrylate, isopropyl methacrylate, n-butyl methacrylate, isobutyl methacrylate, n-hexyl methacrylate, lauryl methacrylate, acrylic acid, methacrylic acid, maleic acid, itaconic acid, 2-hydroxyethyl methacrylate, 2-hydroxypropyl methacrylate, 2-hydroxyethyl acrylate, 2-hydroxypropyl acrylate, polyethylene glycol mono(meth)acrylate, polypropylene glycol mono(meth)acrylate, phenoxyethyl (meth)acrylate, 2-(meth)acryloxyethylhydrogen phthalate, 2-(meth)acryloxyethylhydrogen succinate, acrylamide, N-methylolacrylamide, diacetonacrylamide, glycidyl methacrylate, acrylnitrile, styrene, vinyltoluene, isobutene, 3-methyl-1-butene, butylvinyl ether, N-vinylcarbazole, methyl vinyl ketone, nitroethylene, methyl a-cyanoacrylate, vinylidene cyanide, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa (meth)acrylate, hexanediol di(meth)acrylate, trimethylolpropane tri(acryloyloxypropyl) ether, those obtained by adding ethylene oxide or propylene oxide to a polyfunctional alcohol such as glycerol, trimethylolethane or trimethylolpropane, and (meth)acrylating the addition reaction product. Furthermore, the polymers and copolymers obtained by polymerizing and copolymerizing their derivatives can also be used as binder polymers.

(2) Unvulcanized Rubbers

Natural rubber (NR) and homopolymers and copolymers of monomers selected from butadiene, isoprene, styrene, acrylonitrile, acrylates and methacrylates, for example, polybutadiene (BR), styrene-butadiene copolymer (SBR), carboxy modified styrene-butadiene copolymer, polyisoprene (NR), polyisobutylene, polychloroprene (CR), polyneoprene, acrylate-butadiene copolymers, methacrylate-butadiene copolymers, acrylate-acrylnitrile copolymer (ANM), isobutylene-isoprene copolymer (IIR), acrylonitrile-butadiene copolymer (NBR), carboxy modified acrylonitrile-butadiene copolymer, acrylonitrile-chloroprene copolymer, acrylonitrile-isoprene copolymer, ethylene-propylene copolymer (EPM, EPDM), vinylpyridine-styrene-butadiene copolymer, styrene-isoprene copolymer, etc. These rubbers modified usually, for example, by epoxyation, chlorination, carboxylation, etc. and blends with other polymers can also be used as binder polymers.

(3) Polyoxides (Polyethers)

Polymers and copolymers obtained by the ring-opening polymerization of trioxane, ethylene oxide, propylene oxide, 2,3-epoxybutane, 3,4-epoxybutene, 2,3-epoxypentane, 1,2-epoxyhexane, epoxycyclohexane, epoxycycloheptane, epoxycyclooctane, styrene oxide, 2-phenyl-1,2- epoxypropane, tetramethyl ethylene oxide, epichlorohydrin, epibromohydrin, allylglycidyl ether, phenylglycidyl ether, n-butylglycidyl ether, 1,4-dichloro-2,3-epoxybutane, 2,3-epoxypropionaldehyde, 2,3-epoxy-2-methylpropionaldehyde, 2,3-epoxydiethylacetal, etc. can also be used as binder polymers.

(4) Polyesters

Polyesters obtained by the polycondensation between any of the following polyhydric alcohols and any of the following polycarboxylic acids, polyesters obtained by the polymerization of the following polyhydric alcohols and the following polycarboxylic anhydrides, polyesters obtained by ring-opening polymerization of the following lactones, etc., polyesters obtained from the mixtures of these polyhydric alcohols, polycarboxylic acids, polycarboxylic anhydrides and lactones, etc. can also be used.

The polyhydric alcohols include ethylene glycol, propylene glycol, 1,3-propanediol, 1,4-butanediol, 1,3-butylene glycol, 1,5-pentanediol, 1,6-hexanediol, diethylene glycol, dipropylene glycol, neopentyl glycol, triethylene glycol, p-xylylene glycol, hydrogenated bisphenol A, bisphenol p-xylylene glycol, hydrogenated bisphenol A, bisphenol dihydroxypropyl ether, glycerol, trimethylolethane, trimethylolpropane, trishydroxymethylaminomethane, pentaerythritol, dipentaerythritol, sorbitol, etc.

The polycarboxylic acids and polycarboxylic anhydrides include phthalic anhydride, isophthalic acid, terephthalic acid, succinic anhydride, adipic acid, azelaic acid, sebacic acid, tetrahydrophthalic anhydride, hexahydrophthalic anhydride, tetrabromophthalic anhydride, tetrachlorophthalic anhydride, hetic anhydride, nadic anhydride, maleic anhydride, fumaric acid, itaconic acid, trimellitic anhydride, methylcyclohexenetricarboxylic anhydride, pyromellitic anhydride, etc.

The lactones include b-propiolactone, g-butyrolactone, d-valerolactone, e-caprolactone, etc.

(5) Polyurethanes

The polyurethanes obtained from the following polyisocyanates and polyhydric alcohols can also be used as the binder polymers. The polyhydric alcohols include the polyhydric alcohols enumerated for the above polyesters, the following polyhydric alcohols, condensation polyester polyols with hydroxyl groups at both the ends obtained by polycondensation between any of these polyhydric alcohols and any of the polycarboxylic acids enumerated for the polyesters, polyester polyols obtained from the above lactones, polycarbonate diols, polyether polyols obtained by the ring-opening polymerization of propylene oxide and tetrahydrofuran or modification of epoxy resins, acrylic polyols as copolymers between an acrylic (or methacrylic) monomer with a hydroxyl group and an acrylate (or methacrylate), polybutadiene polyols, etc.

The isocyanates include paraphenylene diisocyanate, 2,4- or 2,6-toluylene diisocyanate (TDI), 4,4-diphenylmethane diisocyanate (MDI), tolidine diisocyanate (TODI), xylylene diisocyanate (XDI), hydrogenated xylylene diisocyanate, cyclohexane diisocyanate, metaxylylene diisocyanate (MXDI), hexamethylene diisocyanate (HDI or HMDI), lysine diisocyanate (LDI) (=2,6-diisocyanate methylcaproate), hydrogenated MDI (H12MDI) (=4,4'-methylenebis(cyclohexylisocyanate)), hydrogenated TDI (HTDI) (=methylcyclohexane 2,4(2,6)diisocyanate), hydrogenated XDI (H6XDI) (=1,3-(isocyanatomethyl) cyclohexane), isophorone diisocyanate (IPDI), diphenyl ether isocyanate, trimethylhexamethylene diisocyanate (TMDI), tetramethylxylylene diisocyanate, polymethylene-polyphenyl isocyanate, dimeric acid diisocyanate (DDI), triphenylmethane triisocyanate, tris(isocyanatophenyl) thiophosphate, tetramethylxylylene diisocyanate, lysine ester triisocyanate, 1,6,11-undecane triisocyanate, 1,8-diisocyanato-4-isocyanatomethyloctane, 1,3,6-hexamethylene triisocyanate, bicycloheptane triisocyanate, etc. The polyhydric alcohol adducts, polymers, etc. of polyisocyanates can also be used.

Typical polyhydric alcohols other than those enumerated for the above polyesters include polypropylene glycol, polyethylene glycol, polytetramethylene glycol, ethylene oxide-propylene oxide copolymer, tetrahydrofuran-ethylene oxide copolymer, tetrahydrofuran-propylene oxide copolymer, etc. The polyester diols include polyethylene adipate, polypropylene adipate, polyhexamethylene adipate, polyneopentyl adipate, polyhexamethyleneneopentyl adipate, polyethylenehexamethylene adipate, etc., and furthermore, poly-ε-caprolactonediol, polyhexamethylenecarbonatodiol, polytetramethylene adipate, sorbitol, sucrose, etc.

Moreover, various phosphorus-containing polyols, halogen-containing polyols, etc. can also be used as polyols.

In addition, branched polyurethane resins and polyurethane resins with various functional groups such as hydroxyl groups etc. can also be used as the binder polymers.

Furthermore, a chain elongating agent can also be used, which can be selected from p-xylylenediamine, 1,4-diaminocyclohexane, p-phenylenediamine, bis(4-aminocyclohexyl)methane, 1,2-diaminopropane, 2,3-diaminobutane, piperazine, 4,4'-diamino-diphenylmethane, trimethylene glycol-di-p-aminobenzoate, 4,4'-3,3'-diamino-dichloro-diphenylmethane, etc.

(6) Polyamides

The polyamides proposed conventionally can also be used as the binder polymers. The basic composition is any of the copolymers of the following monomers; ε-caprolactam, ω-laurolactam, ω-aminoundecanoic acid, hexamethylenediamine, 4,4'-bis-aminocyclohexylmethane, 2,4,4-trimethylhexamethylenediamine, isophoronediamine, diglycols, isophthalic acid, adipic acid, sebacic acid, dodecanoic diacid, etc.

To describe in more detail, polyamides can be generally classified into water soluble polyamides and alcohol soluble polyamides. The water soluble polyamides include the polyamides containing sulfonic acid groups or sulfonate groups obtained by copolymerizing sodium 3,5-dicarboxybenzenesulfonate, etc. as disclosed in Japanese Patent Laid-open (Kokai) SHO 48-72250, the polyamides with ether bonds obtained by copolymerizing any one of dicarboxylic acids, diamines and cyclic amides with an ether bond in the molecule as disclosed in Japanese Patent Laid-Open (Kokai) SHO 49-43465, the polyamides containing basic nitrogen obtained by copolymerizing N,N'-di(g-aminopropyl)piperazine, etc. and the quaternary polyamides obtained by converting these polyamides by acrylic acid, etc. as disclosed in Japanese Patent Laid-Open (Kokai) SHO 50-7605, the copolymerized polyamides containing polyether segments of 150 to 1500 in molecular weight proposed in Japanese Patent Laid-Open (Kokai) SHO 55-74537, and polyamides obtained by the ring-opening polymerization of a-(N,N'-dialkylamino)-e-caprolactams and by the ring-opening copolymerization between any of a-(N,N'-dialkylamino)-e-caprolactams and e-caprolactam, etc.

The copolymerized polyamides containing polyether segments of 150 to 1500 in molecular weight include copolymerized polyamides containing 30 to 70 wt % of a component consisting of polyoxyethylene of 150 to 1500 in the molecular weight of the polyether segment with amino groups at the ends, and an aliphatic dicarboxylic acid or a diamine.

The alcohol soluble polyamides include linear polyamides synthesized from a dibasic acid fatty acid and a diamine, w-amino acid, lactam or any of their derivatives by any conventional method. Not only homopolymers, but also copolymers, block polymers, etc. can be used. Typical examples are nylons 3, 4, 5, 6, 8, 11, 12, 13, 66, 610, 6/10 and 13/13, polyamide obtained from metaxylylenediamine and adipic acid, polyamides obtained from trimethylhexamethylenediamine or isophoronediamine and adipic acid, e-caprolactam/adipic acid/hexamethylenediamine/4,4'-diaminodicyclohexylmethane copolymerized polymer, e-caprolactam/adipic acid/hexamethylenediamine/2,4,4'-trimethylhexamethylenediamine copolymerized polyamide, e-caprolactam/adipic acid/hexamethylenediamine/isophoronediamine copolymerized polyamide, polyamides containing any of these components, their N-methylol and N-alkoxymethyl derivatives, etc.

One or more as a mixture of these polyamides can be used as the binder polymer.

The polymers which can be the binder polymers can be used alone or as a mixture of plural polymers.

Among the binder polymers, polyurethanes, polyesters, vinyl based polymers, and unvulcanized rubbers are preferable. Especially, polyurethanes are most preferable. A waterless lithographic printing plate using a polyurethane resin has high printing durability which cannot be achieved by the water-less lithographic printing plates using any other form holding ingredient.

As for the tensile properties of the dry sheet of the binder polymer used for the photosensitive layer, it is preferable that the 100% stress value is 20 to 250 kgf/cm2, more preferably 80 to 180 kgf/cm2, and that the rupture elongation is 300% or more, more preferably 400% or more. If the 100% stress value is less than 20 kgf/cm2, the photosensitive layer is too soft, and it is difficult to achieve a high peel bonding strength between the photosensitive layer and the silicone rubber layer. If the 100% stress value is more than 250 kgf/cm2 and if the rupture elongation is less than 300%, inking is unpreferably poor though a high peel bonding strength can be liable to be achieved between the photosensitive layer and the silicone rubber layer.

The tensile properties of the dry sheet of the binder polymer can be measured according to JIS K 6301. That is, a glass sheet is coated with a solution containing a binder polymer only, and the solvent is vaporized. The coated glass sheet is then dried at 80-C for 8 hours, to obtain an about 0.3 to 0.1 mm thick binder polymer sheet. From the sheet, test pieces are obtained by punching using a No. 4 dumbbell die. The test pieces are tested at a tensile speed of 200 mm/min using Tensilon RTM-100 (produced by Orienteck K.K.) 4 times, according to JIS K 6301.

In addition to the above ingredients, additives such as dye, pigment, photo coupler, acid, catalyst, photo absorbent, etc. can be added as required.

Furthermore, for the purpose of holding the form of the photosensitive layer to keep the silicone rubber layer on it horizontal in parallel to the substrate face, or enhancing the adhesiveness to the silicone rubber layer, the photosensitive layer can further contains organosilica, silane coupling agent, silylated monomer or organic metal compound. Examples of these additives are enumerated below.

(1) The organosilica can be selected, for example, from Oscal 1432 and Oscal 1132 (organosilica powders produced by Shokubai Kasei Kogyo K.K.), etc.

(2) The silane coupling agent can be selected, for example, from 3-aminopropyltrimethoxysilane, 3-methacryloxypropyltrimethoxysilane, γ-glycidoxytrimethoxysilane, γ-mercaptopropyltrimethoxysilane, etc.

(3) The silylated monomer can be selected, for example, from N,N,N'-tri-(2-hydroxy-3-methacryloyloxypropyl)-N'-mono-(2-hydroxy-3-trimethoxysilylpropyloxypropyl) trioxypropylenediamine, N,N'-di-(2-hydroxy-3-methacryloyloxypropyl)-N,N'-di-(2-hydroxy-3-trimethoxysilylpropyloxypropyl)trioxypropylenediamine, N,N,N'-tri-(2-hydroxy-3-methacryloyloxypropyl)-N'-mono-(2-hydroxy-3-methyldimethoxysilylpropyloxypropyl) trioxypropylenediamine, N,N'-di-(2-hydroxy-3-methacryloyloxypropyl)-N,N'-di-(2-hydroxy-3-methyldimethoxysilylpropyloxypropyl) trioxypropylenediamine, etc.

(4) The organic metal compound can be selected, for example, from dibutyltin diacetate, dibutyltin dilaurate, tetrabutyl titanate, tetraisopropyl titanate, etc.

Furthermore as required, an inorganic powder and a polymer can also be contained in the photosensitive layer.

The photosensitive layer is applied uniformly on a substrate, and if it adheres to the substrate, its thickness can be optional, but should be preferably 100 m or less, more preferably 30 m or less.

The silicone rubber layer formed on the photosensitive layer in the present invention should be 0.5 to 50 m, preferably 0.5 to 10 m in thickness and be transparent to allow transmission of ultraviolet rays.

The silicone rubber layer of the present invention can be formed by diluting a silicone gum composition consisting of a polyorganosiloxane and, as required, a crosslinking agent and a catalyst by a proper solvent, applying it onto the photosensitive layer, and heating and drying for hardening it. The silicone gum composition preferably used in the present invention is a wet heat setting condensation reaction crosslinkable silicone gum composition or a thermosetting addition reaction crosslinkable silicone gum composition. At first the wet heat setting condensation reaction crosslinkable silicone gum composition is described below. The polyorganosiloxane used here means a linear polyorganosiloxane represented by the following general formula (1). The silicone gum composition in the present invention means an unhardened (unrubberized) solution composition obtained by dissolving the polyorganosiloxane into a proper solvent and mixing the solution together with a crosslinking agent, catalyst, etc. On the other hand, the silicone rubber means a rubberized hardened product obtained by crosslinking the silicone gum composition under any proper hardening condition.

(where n stands for an integer of 1 or more; R1 and R2 stand for, respectively independently, an alkyl group, alkoxy group, aminoalkyl group, haloalkyl group or hydroxyalkyl group respectively with 1 to 10 carbon atoms, a carboxyalkyl group or cyanoalkyl group respectively with 2 to 10 carbon atoms, a substituted or non-substituted aryl group, aryloxy group or aralkyl group respectively with 6 to 20 carbon atoms, a hydrogen atom or hydroxyl group; furthermore at least one or more hydroxyl groups are contained in the molecular chain at the chain ends or as side chains).

The condensation reaction crosslinkable silicone gum composition preferably used in the present invention is room temperature (low temperature) moisture setting composition obtained by adding a crosslinking agent and, as required, a catalyst to an organic solvent solution of the linear polyorganosiloxane represented by the above general formula (1). The crosslinking agent used for preparing the silicone gum composition can be preferably selected from acetoxysilane, ketooximesilanes, alkoxysilanes, aminosilanes, amidosilanes, etc. represented by the following general formula (2). Usually a crosslinking agent which reacts with a linear polyorganosiloxane with at least one or more hydroxyl groups in the molecular chain, for condensation reaction by removing acetic acid, oxime, alcohol, amine or amide, etc. is used alone or as a mixture with another similar crosslinking agent or as a condensation product.

Especially in the present invention, a ketooximesilane or alkoxysilane, etc. can be preferably used.

$$Rm.Si.Xn \quad (2)$$

(where m stands for an integer of 0 or more, while n stands for an integer of 1 or more, subject to the condition of m+n=4; R stands for a substituted or non-substituted alkyl group, aminoalkyl group, aminoalkyleneaminoalkyl group, or aminoalkyleneaminomethylphenethyl group respectively with 1 to 20 carbon atoms, or a substituted or non-substituted aryl group with 6 to 20 carbon atoms; X stands for —OR1, —OCOR2, —O—N=CR3—R4, or —O—C=CR5H; and R1 to R5 stand for, respectively independently, a substituted or non-substituted alkyl group with 1 to 4 carbon atoms).

The compounds represented by the general formula (2) and their condensation products which can be used as the crosslinking agents include the following:

Tetramethoxysilane, tetraethoxysilane, methyltrimethoxysilane, ethyltrimethoxysilane, dimethyldiethoxysilane, diethyldiethoxysilane, methyltriethoxysilane, ethyltriethoxysilane, tetraacetoxysilane, methyltriacetoxysilane, ethyltriacetoxysilane, dimethyldiacetoxysilane, γ-aminopropyltriethoxysilane, N-(β aminoethyl)-γ-aminopropyltrimethoxysilane, N-(βaminoethyl)-γ-aminopropyltriethoxysilane, γ-glycidoxypropyltrimethoxysilane, γ-glycidoxypropyltriethoxysilane, γ-chloropropyltriethoxysilane, N-(βaminoethyl) aminomethylphenethyltrimethoxysilane, N-(β aminoethyl) aminomethylphenethyltriethoxysilane, tris (methylethylketooxime)methylsilane, tris (methylethylketooxime) ethylsilane, tris (methylethylketooxime)vinylsilane, tetrakis (methylethylketooxime)silane, etc.

The condensation reaction crosslinkable silicone gum composition preferably used in the present invention generally consists of the following:

| | |
|---|---:|
| (1) A polyorganosiloxane represented by the general formula (1) | 100 parts by weight |
| (2) A condensation reaction crosslinking agent represented by the general formula (2) | 3 to 20 parts by weight |
| (3) A condensation catalyst | 0.01 to 20 parts by weight |
| (4) A solvent | 100 to 4000 parts by weight |

The thermosetting addition reaction crosslinkable silicone gum composition is described below. The polyorganosiloxane used here means a poly-hydrogen polyorganosiloxane or polyorganosiloxane with two or more —CH=CH— groups in one molecule. It is dissolved into a proper solvent, and as required, a catalyst, hardening retarder, etc. are added to the solution, to prepare an unhardened (unrubberized) silicone gum composition.

The addition reaction crosslinkable silicone gum composition preferably used in the present invention generally consists of the following:

| | |
|---|---:|
| (1) A polyorganosiloxane with at least two or more alkenyl groups (preferably vinyl groups) directly combined with silicone atoms in one molecule | 100 parts by weight |
| (2) A hydrogen polyorganosiloxane with at least two or more - SiH groups in one molecule | 0.1 to 1000 parts by weight |
| (3) An addition catalyst | 0.00001 to 20 parts by weight |
| (4) A solvent | 100 to 4000 parts by weight |

The alkenyl groups of the polyorganosiloxane as the ingredient (1) can be located either at the ends or intermediate positions of the molecular chain, and the other organic groups than alkenyl groups can be selected from substituted or non-substituted alkyl groups or aryl groups. Furthermore, as required, it may have a slight amount of hydroxyl groups. The polyorganosiloxane as the ingredient (2) reacts with the ingredient (1) to form a silicone rubber layer, but at the same time, also acts to make the photosensitive layer adhesive. The hydrogen groups of the ingredient (2) can be located either at the ends or intermediate positions of the molecular chain, and the other organic groups than hydrogen groups can be selected from the same functional groups as those of the ingredient (1). As for the organic groups of the ingredients (1) and (2), it is preferable in view of ink repellency that 60% or more of all the functional groups are methyl groups. The molecular structures of the ingredients (1) and (2) can be chained, cyclic or branched, and it is preferable in view of the physical properties of the rubber that at least either of them is more than 1000 in number average molecular weight. It is more preferable that the polyorganosiloxane as the ingredient (1) is 1000 or more in number average molecular weight. The polyorganosiloxane as the ingredient (1) can be selected, for example, from a,w-divinylpolymethylsiloxane, (methylvinylsiloxane) (dimethylsiloxane) copolymer with methyl groups at both the ends, etc.

The polyorganosiloxane as the ingredient (2) can be selected, for example, from polydimethylsiloxane with hydrogen atoms at both the ends, a,w-dimethylpolymethylhydrogensiloxane, (methylhydrogensiloxane) (dimethylsiloxane) copolymer with methyl groups at both the ends, polymethylhydrogencyclics, etc. The addition catalyst as the ingredient (3) can be freely selected from known catalysts, but a platinum compound can be used especially preferably. It can be selected, for example, from platinum metal, platinum chloride, chloroplatinic acid, olefin coordinated platinum chain, etc. Furthermore, for the purpose of moderately controlling the hardening speed of the addition reaction crosslinkable silicone gum composition, a hardening retarder, etc. is added. It can be selected, for example, from vinyl group-containing organopolysiloxanes such as tetracyclo(methylvinyl) siloxane, carbon—carbon triple bond-containing alcohols such as acetylacetone alcohol, acetone, methyl ethyl ketone, methanol, ethanol, propylene glycol monomethyl ether, etc.

The addition reaction crosslinkable silicone gum composition can also contain respectively small amounts of a known silane coupling agent, any of the hydroxyl group-containing polyorganosiloxanes defined for the condensation reaction crosslinkable silicone gum composition, and a condensation reaction crosslinking agent containing a hydrolyzable polyfunctional group.

The silicone gum composition preferably used for the ink repellent layer of the present invention can also contain a known filler, inorganic grains, silicic acid sol, etc. for the purpose of moderately reinforcing the ink repellent layer formed by the silicone gum composition, and also a small amount of a known modified silicone oil without any crosslinkable functional group.

The solvent used for diluting and dissolving the silicone gum composition can be one or more as a mixture selected from paraffin hydrocarbons, isoparaffin hydrocarbons, cycloparaffin hydrocarbons and aromatic hydrocarbons. Typical hydrocarbon solvents are distillates of petroleum and their reformed products.

The thickness of the silicone rubber layer preferably used as the ink repellent layer of the present invention should be preferably 0.5 to 10 g/m2, more preferably 1 to 3 g/m2 in dry weight, for good printing durability, ink repellency and image reproducibility.

The silicone rubber layer composed as described above, to be formed on the surface of the water-less lithographic raw plate can also have a thin transparent protective film stuck on the surface, since otherwise the positive film is hard to sufficiently adhere in the step of exposure. The protective film is useful in the step of exposure, but is removed by peeling or dissolving in the step of development, since it is not required in the step of printing.

A useful protective film has violet ray permeability and a thickness of 100 $\pm$m or less, preferably 10 $\pm$m or less, and is typically made of polyethylene, polypropylene, polyvinyl chloride, polyethylene terephthalate, or cellophane, etc. The protective film can be treated to be rough, for further enhancing the adhesiveness to the positive film. It is also possible to form a protective film by coating, etc., instead of using a protective film.

The water-less lithographic raw plate of the present invention as described above can be produced, for example, by, though not limited to, the following method.

At first, a substrate is coated with a primer solution using a coater such as reverse roll coater, extrusion coater, curtain coater or bar coater, dried, and thermally cured, to form a primer layer. Then, it is similarly coated with a sensitizing solution, and dried, to form a photosensitive layer.

Furthermore, it is coated with a silicone gum solution using an extrusion coater, and thermally treated usually at a temperature of 80 to 130-C for several minutes, to sufficiently harden it, for forming a silicone rubber layer. As required, a protective layer may be further applied or a protective film may be laminated onto the silicone rubber layer using a laminator, etc.

In the above production method, to achieve a higher peel bonding strength, in addition to the selection of monomers and polymers as described above, it is preferable to select various production conditions.

For example, if the silicone gum solution is applied at room temperature at a relative humidity of 40% or less, preferably 20% or less, more preferably 10% or less, the monomer with two or more hydroxyl groups in the photosensitive layer is chemically combined with the crosslinking agent in the silicone rubber layer described before, to achieve a peel bonding strength of 5 to 100 g/cm, preferably 10 to 80 g/cm, more preferably 20 to 70 g/cm between the photosensitive layer and the silicone rubber layer. If the silicone gum solution is applied in a high relative humidity atmosphere, the crosslinking agent in the silicone rubber layer reacts at first with the water in air, not allowing a high peel bonding strength to be achieved between the photosensitive layer and the silicone rubber layer unpreferably.

The water-less lithographic raw plate of the present invention thus produced is exposed to active rays through a positive film kept in vacuum contact with the raw plate. The light source used in the step of exposure is usually a high pressure mercury lamp, carbon arc lamp, xenon lamp or fluorescent lamp, etc. After completion of exposure, the printing plate gets the protective film removed as required, and is immersed in a developing solution and developed using a development pad or development brush.

The developing solution used in the present invention can be selected from those usually proposed for water-less lithographic printing plates. For example, a solution obtained by adding any of the following polar solvents to any of the aliphatic hydrocarbons (hexane, heptane, "Isopar" E, G, H (produced by Esso Kagaku K.K.), gasoline, kerosene, etc.), aromatic hydrocarbons (toluene, xylene, etc.) and halogenated hydrocarbons (trichlene, etc.) capable of swelling silicone rubber, or one or more as a mixture selected from the following polar solvents is preferable.

Alcohols (methanol, ethanol, propanol, ethylene glycol, diethylene glycol, triethylene glycol, polyethylene glycol, propylene glycol, dipropylene glycol, tripropylene glycol, polypropylene glycol, 1,3-butylene glycol, 2,3-butylene glycol, hexylene glycol, 2-ethyl-1,3-hexanediol, etc.). Ethers (ethylene glycol monoethyl ether, diethylene glycol monomethyl ether, diethylene glycol monoethyl ether, diethylene glycol monobutyl ether, diethylene glycol monohexyl ether, diethylene glycol mono-2-ethylhexyl ether, triethylene glycol monoethyl ether, tetraethylene glycol monoethyl ether, propylene glycol monomethyl ether, dipropylene glycol monomethyl ether, tripropylene glycol monomethyl ether, etc.). Esters (ethylene glycol monomethyl ether acetate, ethylene glycol monoethyl ether acetate, diethylene glycol monomethyl ether acetate, diethylene glycol monoethyl ether acetate, etc.).

Ketones (acetone, methyl ethyl ketone, methyl isobutyl ketone, diacetone alcohol, etc.).

Carboxylic acids (2-ethylbutyric acid, caproic acid, caprylic acid, 2-ethylhexanoic acid, capric acid, oleic acid, etc.). Especially preferable polar solvents are those which are scarce of offensive odor and hard to ignite, such as ethylene glycol, diethylene glycol, triethylene glycol, polyethylene glycol, propylene glycol, dipropylene glycol, tripropylene glycol, polypropylene glycol, 1,3-butylene glycol, 2,3-butylene glycol, hexylene glycol, 2-ethyl-1,3-hexanediol, diethylene glycol mono-2-ethylhexyl ether, triethylene glycol monoethyl ether and tetraethylene glycol monoethyl ether.

The water-less lithographic raw plate thus obtained is sufficiently high in the peel bonding strength between the photosensitive layer and the silicone rubber layer before exposure, hence very strong also in the photo bonding between the exposed area of the photosensitive layer and the silicone layer, and also excellent in printing durability and image reproducibility.

The present invention is described below in detail in reference to examples.

The methods for measuring the peel bonding strength and the initial elastic modulus were as described before.

The symbols used in the respective examples mean the following:

TABLE 1

| Symbol | Monomer |
| --- | --- |
| Example 1 | |
| M-1 | Addition reaction product of trioxypropylenediamine:glycidyl methacrylate:methylglycidyl ether at a molar ratio of 1:3:1 |
| M-2 | Addition reaction product of tripropylene glycol diglydicyl ether:acrylic acid at a molar ratio of 1:2 |
| M-3 | Polyethylene glycol #200 diacrylate |
| Example 2 | |
| M-1 | Addition reaction product of trioxypropylenediamine:glycidyl methacrylate:methylglycidyl ether at a molar ratio of 1:3:1 |
| M-4 | Addition reaction product of m-xylylenediamine:glycidyl methacrylate:butylglycidyl ether at a molar ratio of 1:2:2 |
| M-5 | 1,9-nonanediol diacrylate |
| Example 3 | |
| M-1 | Addition reaction product of trioxypropylenediamine:glycidyl methacrylate:methylglycidyl ether at a molar ratio of 1:3:1 |
| M-6 | Addition reaction product of p-xylylenediamine:glycidyl methacrylate:butylglycidyl ether at a molar ratio of 1:2:2 |
| M-7 | 1,6-hexanediol diacrylate |
| Example 4 | |
| M-8 | Addition reaction product of m-xylylenediamine:glycidyl methacrylate at a molar ratio of 1:4 |
| M-3 | Polyethylene glycol #200 diacrylate |
| M-11 | Addition reaction product of trioxypropylenediamine:glycidyl methacrylate:3-glycidoxypropylmethyldimethoxysilane at a motar ratio of 1:2:2 |
| Comparative example 1 | |
| M-8 | Addition reaction product of m-xylylenediamine:glycidyl methacrylate at a molar ratio of 1:4 |
| M-3 | Polyethylene glycol #200 diacrylate |
| Comparative example 2 | |
| M-9 | Addition reaction product of hexamethylenediamine:glycidyl methacrylate at a molar ratio of 1:4 |
| M-6 | 1,9-nonanediol diacrylate |
| Comparative example 3 | |
| M-10 | Addition reaction product of hendecapropylene glycol diglycidyl ether:acrylic acid at a molar ratio of 1:2 |
| M-6 | 1,9-nonanediol diacrylate |
| Comparative example 4 | |
| M-8 | Addition reaction product of m-xylylenediamine:glycidyl methacrylate at a molar ratio of 1:4 |
| M-3 | Polyethylene glycol #200 diacrylate |

TABLE 2

| Symbol | Polymer | Rupture | 100% elongation stress (kgf/mm$^2$) |
| --- | --- | --- | --- |
| P-1 | Polyurethane resin composed of isophorone diisocyanate and a polyester polyol consisting of adipic acid and polyethylene glycol | 490% | 1.43 |
| P-2 | Acrylate copolymer resin PD-8064 (produced by The Nippon Synthetic Chemical Industry Co., Ltd.) | 80% | 5.84 |
| P-3 | Methoxymethylated nylon resin "Tredin" MF30 (produced by Teikoku Kagaku Sangyo K.K.) | 50% | 5.30 |
| P-4 | Polyurethane resin "Crisbon" 3006LV (produced by Dainippon Ink & Chemicals, Inc.) | 490% | 0.82 |

EXAMPLE 1

A 3 mm thick degreased aluminum sheet was coated with a primer solution composed as follows, and dried at 230-C for 1 minute, to form a 3 g/m2 primer layer.

| | |
|---|---|
| (1) "Kancoat" 90T-25-3094 (epoxy phenol resin produced by Kansai Paint Co., Ltd.) 15 parts by weight | |
| (2) Dimethylformamide parts by weight | 85 |

On the primer layer, a sensitizing solution composed as follows was applied, and dried at 100-C for 1 minute, to form a 4 g/m2 thick photosensitive layer.

| | |
|---|---|
| (1) P-1 parts by weight | 56 |
| (2) M-1 parts by weight | |
| (3) M-2 parts by weight | 14 |
| (4) M-3 by weight | 8 parts |
| (5) 4,4'-bis(diethylamino)benzophenone by weight | 5 parts |
| (6) 2,4-diethylthioxanthone by weight | 7 parts |
| (7) Victoria Blue-BOH by weight | 0.3 parts |
| (8) Ethyl cellosolve by weight | 580 parts |

In succession, on the photosensitive layer, a silicone gum solution composed as follows was applied at room temperature (28-C) at a relative humidity of 18%, and dried at 120-C for 2 minutes, to form a 2 g/m2 thick silicone rubber layer.

| | |
|---|---|
| (1) Polydimethylsiloxane with silanol at both the ends (average molecular weight 100,000) parts by weight | 100 |
| (2) (Methyl) ethyltriacetoxysilane parts by weight | 14 |
| (3) Dibutyltin diacetate parts by weight | 0.05 |
| (4) "Isopar" E parts by weight | 750 |

On the plate prepared as above, a 6-micron thick polyethylene terephthalate film "Lumilar" (produced by Toray Industries, Inc.) was laminated as a protective film, to prepare a lithographic raw plate.

A gradation positive film with 150 lines/inch in dots of 2% to 98% was brought into close contact with the lithographic raw plate, and they were exposed to a 3 kW extra-high pressure mercury lamp (produced by Oak Seisakusho) at a distance of 1 m for 90 seconds.

From the exposed plate, the laminated protective film was removed. A developing solution consisting of diethylene glycol mono-2-ethylhexyl ether and 1,3-butylene glycol at a ratio of 70:30 was put into the pretreatment tank of a water-less lithographic automatic processing machine (TWL-1160 produced by Toray Industries, Inc.), and water was put into the developing tank. The plate was developed at a pretreatment temperature of 35-C at a transport speed of 100 cm/min, to obtain a water-less lithographic printing plate.

The printing plate obtained was installed in an offset press (Komori Splint 4-Color Press), and printing was effected on coated paper using "Dry-o-color" blue ink produced by Dainippon Ink & Chemicals, Inc. The printed sheets of paper had a very good image of 150 lines/inch in dots of 2% to 98% reproduced. On the other hand, a positive film with a pattern of 150 lines/inch was brought into close contact with the above lithographic raw plate, and they were exposed to a 3 kW extra-high pressure mercury lamp (produced by Oak Seisakusho) at a distance of 1 m for 90 seconds, and developed as done above, to obtain a water-less lithographic printing plate. The printing plate obtained was installed in a commercial offset press (LITHOPIA produced by Mitsubishi Heavy Industries, Ltd.), and printing was effected on fine quality paper using "Dry-o-color" black, blue, red and yellow inks produced by Dainippon Ink & Chemicals, Inc. at a speed of 800 rpm. As a result, even after printing 250,000 copies, good printing could be effected, and after completion of printing, the printing plate was inspected and found to be slightly damaged.

The peel bonding strength of the lithographic raw plate used for the printing durability test was measured according to the method described before, and found to be 60 g/cm. Furthermore, the initial elastic modulus, rupture elongation and 50% stress value of the photosensitive layer were measured according to the methods described before, and found to be 38 kgf/mm2, 300% and 1.8 kgf/mm2 respectively.

EXAMPLES 2 TO 4, AND COMPARATIVE EXAMPLES 1 TO 4

Printing plates were produced as done in Example 1, except that the monomers and polymers as shown in Table 3 were used.

For Example 4, a silicone gum solution composed as follows was used.

| | |
|---|---|
| (1) Polydimethylsiloxane with vinyl groups at both the ends (polymerization degree 700) 77 parts by weight | |
| (2) (CH3)3Si—O—(Si(CH3)2—O)30—(SiH(CH3)—O)10—Si(CH3)3 parts by weight | 10 |
| (3) Chloroplatinic acid/methylvinylcyclics complex parts by weight | 2.5 |
| (4) Acetylacetone alcohol part by weight | 0.5 |
| (5) Polydimethylsiloxane (polymerization degree 8000) parts by weight | 10 |
| (6) Isopar E parts by weight | 1000 |

A gradation positive film with 150 lines/inch in dots of 2% to 98% was brought into close contact with each of the lithographic raw plates, and they were exposed to a 3 kW extra-high pressure mercury lamp (produced by Oak Seisakusho) at a distance of 1 m for 90 seconds, and developed as done in Example 1, to obtain water-less lithographic printing plates. The printing plates obtained were installed in an offset press (Komori Sprint-Color Press), and printing was effected on coat paper using "Dry-o-color" blue ink produced by Dainippon Ink & Chemicals, Inc. for image reproducibility tests.

A picture-pattern positive film with 150 lines/inch was brought into close contact with each of the lithographic raw plates, and they were exposed to a 3 kW extra-high pressure mercury lamp (produced by Oak Seisakusho) at a distance of 1 m for 90 seconds, and developed as done in Example 1, to obtain water-less lithographic printing plates. The printing plates obtained were installed in a commercial offset press (LITHOPIA produced by Mitsubishi Heavy Industries, Ltd.), and printing was effected on fine quality paper at a speed of 800 rpm using "Dry-o-color" black, blue, red and yellow inks produced by Dainippon Ink & Chemicals, Inc. for printing durability tests.

Table 3 shows the respective results on the peel bonding strength, the initial elastic modulus, rupture elongation, and 50% stress of the photosensitive layer, printing durability and image reproducibility.

with a gradation positive film with 150 lines/inch in dots of 2 to 98%, and they were exposed to a 3 kW extra-high pressure mercury lamp (produced by Oak Seisakusho) at a distance of 1 m for 90 seconds, and developed as done in

TABLE 3

| | Monomer | | Polymer used | Peel bonding strength (g/cm) | Initial elastic modulus (kgf/mm$^2$) | Rupture elongation (%) | 50% stress (kgf/mm$^2$) | Printing durability (10,000 copies) | Image reproducibility (%) |
|---|---|---|---|---|---|---|---|---|---|
| | Kind | Parts by weight | | | | | | | |
| Example 1 | M-1 | 14 | P-1 | 60 | 38 | 300 | 1.8 | 25 | 2-98 |
| | M-2 | 14 | | | | | | | |
| | M-3 | 8 | | | | | | | |
| Example 2 | M-1 | 15 | P-1 | 45 | 47 | 170 | 2.0 | 21 | 2-98 |
| | M-1 | 15 | | | | | | | |
| | M-5 | 6 | | | | | | | |
| Example 3 | M-1 | 14 | P-1 | 29 | 62 | 150 | 2.2 | 15 | 2-98 |
| | M-6 | 14 | | | | | | | |
| | M-7 | 8 | | | | | | | |
| Example 4 | M-8 | 23 | P-4 | 38 | 58 | 120 | 2.4 | 16 | 2-98 |
| | M-3 | 10 | | | | | | | |
| | M-11 | 3 | | | | | | | |
| Comparative example 1 | M-8 | 26 | P-2 | 40 | 95 | 50 | 4.5 | 8 | 2-95 |
| | M-3 | 10 | | | | | | | |
| Comparative example 2 | M-9 | 26 | P-3 | 17 | 102 | 80 | 3.1 | 6 | 5-96 |
| | M-6 | 10 | | | | | | | |
| Comparative example 3 | M-10 | 26 | P-1 | 3 | 25 | 480 | 0.7 | 4 | 5-90 |
| | M-6 | 10 | | | | | | | |
| Comparative example 4 | M-8 | 26 | P-1 | 4 | 54 | 130 | 2.2 | 3 | 2-98 |
| | M-3 | 10 | | | | | | | |

The printing plates of Examples 2 to 4 were in a range from 5 to 100 g/cm in the peel bonding strength of the photosensitive layer and in a range from 5 to 75 kgf/mm2 in the initial elastic modulus of the photosensitive layer, and 130,000 copies or more in printing durability, and provided printed sheets with a good image in dots of 2 to 98% reproduced very well from the positive film with a pattern of 150 lines/inch, as shown in Table 3.

On the other hand, the printing plates of Comparative Examples 1 and 2 high in the initial elastic modulus and the printing plates of Comparative Examples 3 and 4 low in the peel bonding strength were low in printing durability, to allow printing of 80,000 copies or less only. They were also poor in image reproducibility.

EXAMPLES 5 TO 7, AND COMPARATIVE EXAMPLE 5

As shown in Table 4, printing plates were prepared as done in Example 1, except that the silicone gum solution coating conditions only were changed. Each of the lithographic raw plates obtained was brought into close contact with a gradation positive film with 150 lines/inch in dots of 2 to 98%, and they were exposed to a 3 kW extra-high pressure mercury lamp (produced by Oak Seisakusho) at a distance of 1 m for 90 seconds, and developed as done in Example 1, to obtain water-less lithographic printing plates. The printing plates obtained were installed in an offset press (Komori Splint 4-Color Press), and printing was effected on coated paper using "Dry-o-color" blue ink produced by Dainippon Ink & Chemicals, Inc., for image reproducibility tests. Furthermore, each of the lithographic raw plates obtained was brought into close contact with a positive film with a pattern of 150 lines/inch, and they were exposed to a 3 kW extra-high pressure mercury lamp (produced by Oak Seisakusho) at a distance of 1 m for 90 seconds, then being developed as done in Example 1, to obtain water-less lithographic printing plates. The printing plates obtained were installed in a commercial offset press (LITHOPIA produced by Mitsubishi Heavy Industries, Ltd.) and printing was effected on fine quality paper at a speed of 800 rpm using "Dry-o-color" black, blue, red and yellow inks produced by Dainippon Ink & Chemicals Industries, Inc., for printing durability tests.

Table 4 shows the results of peel bonding strength, printing durability and image reproducibility.

TABLE 4

| | Silicone gum coating conditions | | Peel bonding strength (g/cm) | Initial elastic modulus (kgf/mm$^2$) | Rupture elongation (%) | 50% stress (kgf/mm$^2$) | Printing durability (10,000 copies) | Image reproducibility (%) |
|---|---|---|---|---|---|---|---|---|
| | Temperature (°C.) | Relative humidity | | | | | | |
| Example 5 | 28 | 10 | 68 | 38 | 300 | 1.8 | 28 | 4-98 |
| Example 6 | 28 | 35 | 32 | 38 | 300 | 1.8 | 20 | 2-98 |
| Example 7 | 28 | 48 | 15 | 38 | 350 | 1.8 | 13 | 2-98 |
| Comparative example 5 | 28 | 78 | 4 | 38 | 300 | 1.8 | 4 | 2-96 |

The printing plates of Examples 5 to 7 were in a range from 5 to 100 g/cm in the peel bonding strength of the non-exposed area and 38 kgf/mm2 in the initial elastic modulus of the photosensitive layer, and 130,000 copies or more in printing durability, and provided printed sheets with a very good image in dots of 4 to 98% reproduced from the positive film with a pattern of 150 lines/inch. Comparative Example 5 was less than 5 g/cm in the peel bonding strength of the non-exposed area, and 38 kgf/mm2 in the initial elastic modulus of the photosensitive layer as in Examples 5 to 7, and provided printed sheets with a good picture of 2 to 96%, but since it is 40,000 copies in printing durability, it cannot be practically used in the newspaper web offset printing area and the commercial web offset printing area.

Industrial Applicability

The water-less lithographic raw plate of the present invention can be favorably used in all printing areas, but since it is high in printing durability and image reproducibility, it can be especially preferably used in the commercial web offset printing area and the newspaper web offset printing area.

We claim:

1. A water-less lithographic raw plate comprising:
    a photosensitive layer and a silicone rubber layer which are laminated in this order onto a substrate,
    wherein the components of which said photosensitive layer and said silicone rubber layer are composed are laminated onto said substrate under production conditions selected to produce a peel bonding strength between the photosensitive layer and the silicone rubber layer between about 5 to 100 g/cm, and an initial elastic modulus of the photosensitive layer after completion of exposure between about 5 to 75 kgf/mm².

2. The water-less lithographic raw plate of claim 1, wherein the rupture elongation of the photosensitive layer after completion of exposure is 100% or more.

3. The water-less lithographic raw plate of claim 1, wherein the 50% stress of the photosensitive layer after completion of exposure is 0.8 to 3.8 kgf/mm2.

4. The water-less lithographic raw plate of claim 1, wherein the silicone rubber layer is formed by heating to set a condensation reaction crosslinkable silicone gum composition.

5. The water-less lithographic raw plate of claim 1, wherein the silicone rubber layer is formed by heating to set an addition reaction crosslinkable silicone gum composition.

6. The water-less lithographic raw plate of claim 1, wherein the photosensitive layer contains an ethylenic unsaturated compound with two or more hydroxyl groups.

7. The water-less lithographic raw plate of claim 1, wherein the photosensitive layer contains a polyurethane resin.

8. The water-less lithographic raw plate of claim 1, wherein the photosensitive layer contains an ethylenic unsaturated compound with an organic silyl group.

9. The water-less lithographic printing plate, obtained by selectively exposing and developing the water-less lithographic raw plate stated in any of claims 1 through 8.

* * * * *

UNITED STATES PATENT AND TRADEMARK OFFICE
CERTIFICATE OF CORRECTION

PATENT NO. : 5,811,210
DATED : September 22, 1998
INVENTOR(S) : Ken Kawamura et al It is certified that error appears in the above-indentified patent and that said Letters Patent is hereby corrected as shown below:

In column 3, line 20, please change "50 m" to --50μm--.

In column 14, line 22, please change "100 m" to --100μm--;
   line 23, please change "30 m" to --30μm--;
   line 25, please change "50 m" to --50μm--; and
   line 26, please change "10 m" to --10μm--.

In column 21, line 7, please change "(epoxy phenol" to --(epoxy·phenol--.

Spanning columns 23 and 24, in Table 4, column 6, row 4, please change "350" to --300--.

Signed and Sealed this

Twenty-second Day of June, 1999

Attest:

Q. TODD DICKINSON

*Attesting Officer*   *Acting Commissioner of Patents and Trademarks*